United States Patent
Jiang et al.

(10) Patent No.: US 11,398,286 B1
(45) Date of Patent: Jul. 26, 2022

(54) SEMICONDUCTOR MEMORY DEVICE

(71) Applicant: Yangtze Memory Technologies Co., Ltd., Hubei (CN)

(72) Inventors: Ke Jiang, Wuhan (CN); Huamin Cao, Wuhan (CN); Zilong Chen, Wuhan (CN); Bin Xiang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 17/213,487

(22) Filed: Mar. 26, 2021

Related U.S. Application Data

(63) Continuation of application No. PCT/CN2021/072615, filed on Jan. 19, 2021.

(51) Int. Cl.
  *G11C 16/34* (2006.01)
  *G11C 16/08* (2006.01)
  *G11C 16/10* (2006.01)

(52) U.S. Cl.
  CPC .......... *G11C 16/3459* (2013.01); *G11C 16/08* (2013.01); *G11C 16/10* (2013.01)

(58) Field of Classification Search
  CPC ................................................ G11C 16/3459
  USPC .................................................... 365/185.22
  See application file for complete search history.

(56) References Cited

U.S. PATENT DOCUMENTS

| | | | |
|---|---|---|---|
| 9,552,883 B1 | 1/2017 | Jung | |
| 10,249,382 B2 | 4/2019 | Lee et al. | |
| 10,360,974 B2 | 7/2019 | Kondo | |
| 10,431,314 B2 | 10/2019 | Kim et al. | |
| 10,580,495 B2 | 3/2020 | Ben-Rubi et al. | |
| 2017/0025178 A1 | 1/2017 | Jung | |
| 2017/0242632 A1* | 8/2017 | Cho | G06F 16/902 |
| 2019/0066818 A1 | 2/2019 | Lee et al. | |
| 2019/0088313 A1 | 3/2019 | Kondo | |
| 2019/0172544 A1 | 6/2019 | Kim et al. | |

(Continued)

FOREIGN PATENT DOCUMENTS

| | | | |
|---|---|---|---|
| CN | 109427396 A | 3/2019 | |
| CN | 109872761 A | 6/2019 | |

(Continued)

OTHER PUBLICATIONS

International Search Report dated Oct. 15, 2021 in PCT/CN2021/072615 (submitting English translation only), 4 pages.

*Primary Examiner* — Jason Lappas
(74) *Attorney, Agent, or Firm* — Oblon, McClelland, Maier & Neustadt, L.L.P.

(57) ABSTRACT

A semiconductor memory device includes a memory cell array and peripheral circuitry. The memory cell array includes a block of memory cells The peripheral circuitry can perform first program-verify loops in response to a first write operation to a first word line in a word line group to program memory cells associated with the first word line to multiple states. The word line group includes one or more word lines. Then, the peripheral circuitry determines verification start loops of the multiple states based on sensing results in the first program-verify loops, and performs second program-verify loops with the determined verification start loops of the multiple states in response to a second write operation to a second word line in the word line group.

20 Claims, 7 Drawing Sheets

(56) References Cited

U.S. PATENT DOCUMENTS

| | | |
|---|---|---|
| 2019/0198113 A1 | 6/2019 | Ben-Rubi et al. |
| 2020/0350017 A1 | 11/2020 | Lee |
| 2020/0402580 A1 | 12/2020 | Kim et al. |

FOREIGN PATENT DOCUMENTS

| | | |
|---|---|---|
| CN | 109947663 A | 6/2019 |
| CN | 111863077 A | 10/2020 |
| CN | 112099730 A | 12/2020 |

\* cited by examiner

|  | STATE S1 | STATE S2 | STATE S3 | ... |
|---|---|---|---|---|
| WORD LINE GROUP 1 | 1 | 3 | 4 |  |
| WORD LINE GROUP 2 | 1 | 2 | 4 |  |
| WORD LINE GROUP 3 | 2 | 2 | 4 |  |
| WORD LINE GROUP 4 | 1 | 3 | 5 |  |
| WORD LINE GROUP 5 | 0 | 0 | 0 |  |
| WORD LINE GROUP 6 | 1 | 3 | 4 |  |
| WORD LINE GROUP 7 | 1 | 3 | 4 |  |
| ... |  |  |  |  |

SEMICONDUCTOR MEMORY DEVICE

RELATED APPLICATION

This application is a bypass continuation of International Application No. PCT/CN2021/072615, filed on Jan. 19, 2021. The entire disclosure of the prior application is hereby incorporated by reference in its entirety.

TECHNICAL FIELD

The present application describes embodiments generally related to semiconductor memory devices.

BACKGROUND

Semiconductor memory devices can be categorized into volatile memory devices and non-volatile memory devices. The volatile memory devices lost data when power is off. The non-volatile memory devices can retain stored data even power is disconnected. To achieve higher data storage density, semiconductor manufactures developed vertical device technologies, such as three dimensional (3D) NAND flash memory technology, and the like. 3D NAND flash memory device is a kind of non-volatile memory devices.

SUMMARY

Aspects of the disclosure provide a semiconductor memory device. The semiconductor memory device includes a memory cell array and peripheral circuitry coupled with the memory cell array. The memory cell array includes a block of memory cells. The peripheral circuitry is configured to perform first program-verify loops in response to a first write operation to a first word line in a word line group to program memory cells associated with the first word line to multiple states. The word line group includes one or more word lines. Then, the peripheral circuitry determines verification start loops of the multiple states based on sensing results in the first program-verify loops, and performs second program-verify loops with the determined verification start loops of the multiple states in response to a second write operation to a second word line in the word line group.

In some embodiments, the peripheral circuitry is configured to count a total number of turn-on memory cells of a state during the first program-verify loops, and determine a loop to be a verification start loop of the state when the total number of turn-on memory cells of the state at the loop satisfies a requirement. In an embodiment, the peripheral circuitry includes a first counter circuit configured to count the total number of turn-on memory cells of the state, a second counter circuit configured to count a number of loops in the first program-verify loops, and a comparison circuit configured to compare the total number of turn-on memory cells of the state to a threshold. The comparison circuit can cause the number of loops to be stored as the verification start loop with the state in response to the total number of turn-on memory cells of the state being equal or larger than the threshold.

According to an aspect of the disclosure, the peripheral circuitry includes a page buffer circuit with latch circuits coupled to the bit lines. Values in the latch circuits during the first program-verify loops are indicative of the sensing results in the first program-verify loops.

In some examples, the peripheral circuitry includes a memory configured to store the determined verification start loops of the multiple states in association with the word line group. In an example, the memory is a volatile memory that loses the determined verification start loops of the multiple states in response to a power off.

In some examples, the peripheral circuitry is configured to perform, after a power up of the semiconductor memory device, the first program-verify loops in response to the first write operation to the first word line in the word line group.

In an example, the word line group is defined to include the first word line. In another example, the word line group is defined to include the first word line and one or more other word lines of the block. In another example, the word line group is defined to include the block.

In some examples, the word line group is defined in a non-volatile portion of the semiconductor memory device.

It is noted that the second word line can be the first word line or can be another word line in the word line group.

In some embodiments, the multiple states respectively represent values of multiple binary bits.

Aspects of the disclosure provide a method for programming a semiconductor memory device. For example, the method includes performing first program-verify loops in response to a first write operation to a first word line in a word line group that comprises one or more word lines. The first program-verify loops program memory cells associated with the first word line in the word line group to multiple states. Further, the method includes determining verification start loops of the multiple states based on sensing results during the first program-verify loops, and performing second program-verify loops with the determined verification start loops of the multiple states in response to a second write operation to a second word line in the word line group.

Aspects of the disclosure also provide a method for forming a semiconductor memory device. For example, the method includes separating a block of memory cells into one or more word line groups according to a program speed characterization. Memory cells associated with a word line are configured to be programmed to multiple states according to program-verify loops in response to a write operation to the word line. Further, the method includes defining the one or more word line groups in a non-volatile portion of the semiconductor memory device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 shows an exemplary loop up table of values stored in association with states and groups.

DETAILED DESCRIPTION

Figure 1:
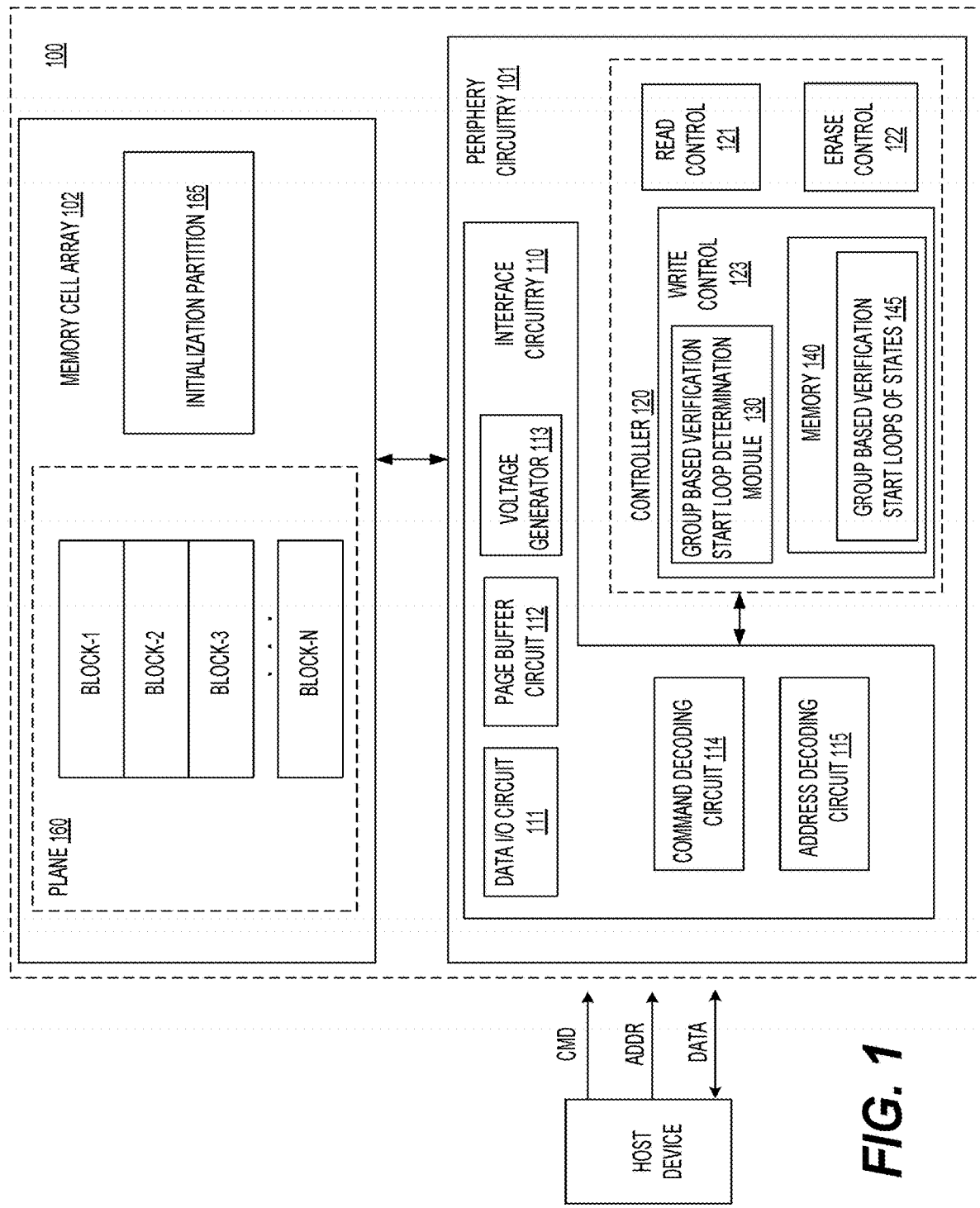
FIG. 1 shows a block diagram of a semiconductor memory device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide semiconductor memory devices and techniques for forming and using the semiconductor memory devices. Generally, a semiconductor memory device includes a memory cell array portion and a peripheral circuitry portion. The peripheral circuitry portion interfaces the memory cell array portion with external circuitry and provides various controls to the memory cell array portion.

According to some aspects of the disclosure, the memory cell array portion includes memory cells that are configured to store multiple binary bits in each memory cell. Generally, a memory cell can be configured into two states to store a binary bit, and can be configured into more than two states to store multiple binary bits. In an example, each memory cell is configured to store two binary bits, and the memory cell can be configured into four states based on threshold voltage of the memory cell. For example, the memory cell can be erased and have a threshold voltage in a first range (e.g., [−3V, −1V]) that corresponds to a first state (e.g., binary "11") of the two bits; the memory cell can be programed to have a threshold voltage in a second range (e.g., [0V, 1V]) that corresponds to a second state (e.g., binary "01") of the two bits; the memory cell can be programmed to have a threshold voltage in a third range (e.g., [1V, 2V]) that corresponds to a third state (e.g., binary "10") of the two bits; and the memory cell can be programed to have a threshold voltage in a fourth range (e.g., [2V, 3V]) that corresponds to a fourth state (e.g., binary "00") of the two bits.

It is noted that while two binary bits are used in some examples in the present disclosure, the present disclosure is not limited to the two binary bits. In some examples, each memory cell can be similarly configured to store other suitable number of binary bits, such as three bits, four bits, and the like.

According to an aspect of the disclosure, the multiple binary bits can be written to a memory cell using program-verify loops. Each program-verify loop includes a program step, and a verification step. In the program step, a programming pulse (e.g., having a pulse voltage higher than 18V) can be applied to the gate terminal of the memory cell with other suitable biases to suitably increase the threshold voltage, for example, by injecting electrons into a floating gate of the memory cell. In the verification step, verification voltages can be applied to the gate terminals with other suitable biases to determine whether the threshold voltage of the memory cell is in the appropriate range. When the threshold voltage is out of the appropriate range at the lower side (e.g., the memory cell is turned off in response to a verification voltage), another program-verify loop can be executed. The program-verify loops can be performed until the threshold voltage of the memory cell is in the appropriate range (e.g., the memory cell is turned on in response to a verification voltage). In some examples, the voltage level of the programming pulse can be adjusted, such as using the incremental step pulse programming (ISPP) technique.

According to another aspect of the disclosure, data can be written to multiple memory cells at the same time (e.g., using a same set of program-verify loops). In an example, multiple memory cells share a word line that is connected to the gate terminals of the multiple memory cells, and thus the programing pulse can be applied to the gate terminals of the multiple memory cells. Based on other biases for the respective memory cells, programming can be allowed or inhibited for the respective memory cells. In an example, a relatively low voltage (e.g., 0V) is applied to the bit line of a memory cell to allow programming, and the programing pulse can cause injection of electrons into the floating gate of the memory cell. In another example, a relatively high voltage (e.g., 10V) is applied to the bit line of a memory cell to inhibit programming, and the injection of electrons to the floating gate of the memory cell is inhibited in response to the programming pulse.

According to some aspects of the disclosure, program speed of the memory cells can vary with various factors. In an example, memory cells sharing the same word line may have slightly different program speed due to, for example, voltage distribution of the programming pulse over the word line, and the like. The distribution of the program speed of memory cells sharing the same word line can be relatively narrow (e.g., a relatively small variance). In another example, memory cells of different word lines in a same memory block can have significant difference in program speed due to, for example, programming pulse voltage level difference, channel bias voltage difference, and the like. The distribution of the program speed of memory cells associated with different word lines in a same block can be relatively large (e.g., a relatively large variance). In another example, memory cells of different blocks can have significant difference in program speed due to various differences of the different blocks. The distribution of the program speed of memory cells of different blocks can be significantly large (e.g., a significantly large variance).

Further, according to an aspect of the disclosure, program speed for a memory cell can change. For example, after a large number of program-erase (PE) cycles, the program speed of a memory cell can change significantly.

In some related examples, a set of program-verify loops with fixed verification start loop is used for programing memory cells in a semiconductor device. In some examples, a verification start loop for a state is selected using an earliest program-verify loop (e.g., in order to verify a memory cell with a fastest program speed to the state) to ensure correct programming for the worst case (e.g., with the fastest program speed). In an example, the verification start loop for a first state (S1) is loop 1; the verification start loop for a second state (S2) is loop 2, and the verification start loop for a third state (S3) is loop 3. In an example, when most of the memory cells are programed to the third state, for example, at much later program-verify loops, the selection of the earliest program-verify loop can elongate the programming time (tPROG). In addition, when the program speed changes, the fixed verification start loops may not be suitable for the changed program speed.

Some aspects of the disclosure provide techniques to determine verification start loops of a semiconductor memory device during usage. The verification start loops of the semiconductor memory device can be adjusted differently for different sections of memory cells in the semiconductor memory device, and can be adjusted in response to usage, such as PE cycles, of the semiconductor memory device.

FIG. 1 shows a block diagram of a semiconductor memory device 100 according to some embodiments of the disclosure. The semiconductor memory device 100 includes a memory cell array 102 and peripheral circuitry 101 coupled together. In some examples, the memory cell array 102 and the peripheral circuitry 101 are disposed on a same die (chip). In other examples, the memory cell array 102 is disposed on an array die, the peripheral circuitry 101 is disposed on a different die, such as a die that is implemented using complementary metal-oxide-semiconductor (CMOS) technology and is referred to as CMOS die. The array die and the CMOS die are suitably bonded, and electrically coupled together. An example of bonded array die and CMOS die will be described with reference to FIG. 3.

In some examples, a CMOS die can be coupled with multiple array dies. In an embodiment, the semiconductor memory device 100 is an integrated circuit (IC) package that encapsulates one or more array dies and one or more CMOS dies.

The semiconductor memory device 100 is configured to store data in the memory cell array 102, and perform operations in response to received commands (CMD). In some examples, the semiconductor memory device 100 can receive write command (also referred to as program command in some examples), read command, erase command and the like, and operate accordingly. In an example, the semiconductor memory device 100 receives a write command with an address (ADDR) and data (DATA), the semiconductor memory device 100 then stores the data in the memory cell array 102 at the address. In another example, the semiconductor memory device 100 receives a read command with an address, the semiconductor memory device 100 then accesses the memory cell array 102, and outputs data stored at the address of the memory cell array 102. In another example, the semiconductor memory device 100 receives an erase command with an address, the semiconductor memory device 100 then resets one or more blocks of memory cells at the address to an un-programed state (also referred to erased state), such as "1" in 1-bit, "11" in 2-bit, "111" in 3-bit, and the like in the NAND flash memory technology.

Generally, the memory cell array 102 can include one or more memory planes 160, and each of memory planes 160 can include a plurality of memory blocks, such as block-1 to block-N as shown in FIG. 1. In some examples, concurrent operations can take place at different memory planes 160. In some embodiments, each of the memory blocks block-1 to block-N is the smallest unit to carry out an erase operation. Each memory block includes a number of pages. In some examples, page is the smallest unit that can be programmed. In an example, memory cells of a page can share a word line.

In some embodiments, the memory cell array 102 is a flash memory array, and is implemented using 3D NAND flash memory technology. Each of the memory blocks block-1 to block-N includes a plurality of memory cell strings that are disposed vertically (e.g., perpendicular to a main surface of a die). Each memory cell string includes a plurality of transistors connected in series. The details of the memory cell string will be described with reference to FIG. 3.

In some embodiments, the peripheral circuitry 101 includes an interface circuitry 110 and a controller 120 coupled together.

The interface circuitry 110 includes suitable circuitry to interface with the memory cell array 102 or to interface with external components of the semiconductor memory device 100, such as a host device. In some examples, the interface circuitry 110 includes a first portion that interfaces with a host device and is referred to as a host interface, and a second portion that interfaces with the memory cell array 102 and is referred to as an array interface. In the FIG. 1 example, the interface circuitry 110 includes a command decoding circuit 114, an address decoding circuit 115, a page buffer circuit 112, a data input/output (I/O) circuit 111, and a voltage generator 113 coupled together as shown in FIG. 1.

In some examples, the address decoding circuit 115 can receive address (ADDR) from I/O pins coupled to external circuitry (e.g., the host device) and perform decoding of the address. In some examples, the address decoding circuit 115 can operate with the controller 120 to perform decoding of the address. In some embodiments, the received addresses from the host device are file system logical block addresses. In some examples, the address decoding circuit 115 and the controller 120 can perform functions of a flash translation layer (FTL) to translate from block addresses used by a file system to addresses of physical cells in the memory cell array 102. In an example, the translation from block addresses used by the file system to physical cells in the memory cell array 102 can be used to exclude bad memory cells. In some embodiments, the addresses of the physical cells are in the form of row address (R-ADDR) and column address (C-ADDR). In response to the row address, the address decoding circuit 115 can generate the word line (WL) signals and select signals, such as top select gate (TSG) signal(s), bottom select gate (BSG) signal(s), and the like based on the row address and provide the memory cell array 102 with the WL signals, and select signals. In some examples, during a write operation, the address decoding circuit 115 provides the WL signals and the select signals to the memory cell array 102 to select a page to program. During a read operation, the address decoding circuit 115 can provide the WL signals and the select signals to select a page for buffering. During an erase operation, the address decoding circuit 115 can provide suitable the WL signals and the select signals.

The page buffer circuit 112 is coupled to bit lines (BL) of the memory cell array 102 and is configured to buffer data, such as one or more pages of data during read and write operations. In an example, during a write operation, the page buffer circuit 112 can buffer data to be programed and drive the data to bit lines of the memory cell array 102 to write the data into the memory cell array 102. In another example, during a read operation, the page buffer circuit 112 can sense data on the bit lines of the memory cell array 102 and buffer the sensed data for outputting.

In some embodiments, the page buffer circuit 112 includes latch circuits associated with bit lines. Values in the latch circuits can indicate programming status. For example, during a write operation that writes data to a memory cell in a memory string connected with a bit line, when program-verify loops are used, a latch circuit associated with the bit line can switch values, such as switch from "0" to "1" in response to a turn on of the memory cell (e.g., the memory cell is sufficiently programmed) in a verification step of the program-verify loops. When the latch circuit has the switched value (e.g., "1"), further programming is inhibited to the memory cell. In some examples, the latch circuits can maintain the switched values (e.g., "1") for the rest of the write operation. In an example, when all the latch circuits has the value "1", data in the page buffer circuit 112 (e.g., a page data) has been written to the memory cell array 102.

In the FIG. 1 example, the data I/O circuit 111 is coupled to the page buffer circuit 112 via data lines (DL). In an example (e.g., during a write operation), the data I/O circuit 111 is configured to receive data from external circuitry (e.g., the host device) of the semiconductor memory device 100, and provide the received data to the memory cell array 102 via the page buffer circuit 112. In another example (e.g., during a read operation), the data I/O circuit 111 is configured to output the data from the memory cell array 102 to external circuitry (e.g., host device) based on the column address (C-ADDR).

The voltage generator 113 is configured to generate voltages of suitable levels for the proper operations of the semiconductor memory device 100. For example, during a read operation, the voltage generator 113 can generate voltages of suitable levels for source voltages, body voltage, various WL voltages, select voltages, and like for the read operation. In some examples, the source voltages are provided as an array common source (ACS) voltages to the source terminals of the memory cell array 102 during the read operation; the body voltage is provided to, for example a P-type well (PW) that is the body portion for the memory cell strings, during the read operation. The WL voltages and the select voltages are provided to the address decoding circuit 115, thus the address decoding circuit 115 can output the WL signals and the select signals (e.g. TSG signals and BSG signals) at the suitable voltage level during the read operation.

In another example, during an erase operation, the voltage generator 113 can generate voltages of suitable levels for source voltages, body voltage, various WL voltages, select voltages, BL voltages and like that are suitable for the erase operation. In some examples, the source voltage is provided as ACS voltages to the source terminals of the memory cell array 102 during the erase operation; the PW voltage is provided to the P-type well that is the body portion for the memory cell strings during the erase operation. The WL voltages and the select voltages are provided to the address decoding circuit 115, thus the address decoding circuit 115 can output the WL signals and the BSG and TSG signals at the suitable voltage level during the erase operation. The BL voltages are provided to the page buffer circuit 112, thus the page buffer circuit 112 can drive the bit lines (BL) at proper voltage level during the erase operation. It is noted that the BL voltage may be applied to the bit lines without going through the page buffer circuit 112 in some examples.

In another example, during a write operation, the voltage generator 113 can generate voltages of suitable levels for source voltages, body voltage, various WL voltages, select voltages, BL voltages, verification voltages, reference voltages and like that are suitable for the write operation. In some examples, the source voltage is provided as ACS voltages to the source terminals of the memory cell array 102 during the write operation; the PW voltage is provided to the P-type well that is the body portion for the memory cell strings during the write operation. The WL voltages, the select voltages, and verification voltages are provided to the address decoding circuit 115, thus the address decoding circuit 115 can output the WL signals and the BSG and TSG signals at the suitable voltage level during the write operation. The BL voltages and the reference voltages are provided to the page buffer circuit 112, thus the page buffer circuit 112 can drive the bit lines (BL) at proper voltage level during the write operation, and can sense programming status in the verification steps during the write operation.

In some embodiments, the command decoding circuit 114 is configured to receive commands (CMD) from, for example the host device via I/O pins in command cycles. In some embodiments, the I/O pins can transmit other information, such as addresses in address cycles, data in data cycles. In some embodiments, the received commands are commands according to certain high level protocols (e.g., USB protocols).

In some embodiments, the command decoding circuit 114 and the controller 120 can operate together to decode the received commands. In an example, the command decoding circuit 114 performs initial decoding of the received commands and the decoded commands by the command decoding circuit 114 are provided to the controller 120 for further processing. The controller 120 can perform further decoding, and then generate control parameters for controlling other circuits, such as the page buffer circuit 112, the data I/O circuit 111, the voltage generator 113, and the like based on the commands.

In some embodiments, the controller 120 can control the voltage generator 113 to generate voltages of suitable levels based on the commands. The controller 120 can coordinate the other circuits, to provide signals to the memory cell array 102 at the suitable time and suitable voltage levels.

In the FIG. 1 example, the controller 120 includes a read control 121, an erase control 122 and a write control 123. In an example, in response to a read command, the read control 121 can generate control parameters for generating control signals to read data from the memory cell array 102. In another example, in response to a write command, the write control 123 can generate control parameters for generating control signals to write data to the memory cell array 102. In another example, in response to an erase command, the erase control can generate control parameters for generating control signals to erase one or more blocks of the memory cell array 102.

The controller 120 can be implemented using any suitable techniques.

In some examples, the controller 120 is implemented as a microcontroller unit (MCU) (not shown) and a firmware (FW) memory (not shown). The MCU can include one or more processing cores, the FW memory stores firmware that can be executed by the one or more processing cores. For example, the firmware includes a read module, a write module and an erase module. The MCU can execute the read module to perform functions of the read control 121. The MCU can execute the write module to perform functions of the write control 123. The MCU can execute the erase module to perform functions of the erase control 122.

It is noted that FW memory can be implemented using any suitable non-volatile memory that can retain stored data even power is disconnected. In an example, the FW memory is implemented using read-only memory (ROM). In another example, the FW memory is implemented using programmable ROM. In another example, the FW memory is implemented using erasable programmable ROM.

In some embodiments, the controller 120 can be implemented using logic circuits. In some examples, some portions of the controller 120 or the whole controller 120 can be implemented by logic circuits that can have much faster processing speed than firmware based implementation. In an example, some functions of the controller 120 can be implemented using programmable logic cells that provide flexible development schedule and fast processing speed.

According to some aspects of the disclosure, the write control 123 is configured to determine verification start loops of states (e.g., states for programming multiple binary bits in a memory cell), based on sensing results from programming to one or more word lines in a word line group. The determined verification start loops of states can be stored in association with the word line group. Then, for later programing to word lines in the word line group, the write control 123 can use program-verify loops with the verification start loops of the states.

In some embodiments, the write control 123 includes a group based verification start loop determination module 130 and a memory 140 (or an allocated memory space in a memory). In an embodiment, the group based verification start loop determination module 130 is configured to detect a first write to a word line in a word line group (e.g., after a power up of the semiconductor memory device 100), and use default verification start loops of the states (e.g., earliest verification start loops of the states) to perform first program-verify loops and write data to the word line. Further, the group based verification start loop determination module 130 can monitor results, such as sensing results, values in the latch circuits of the page buffer circuit 112, and the like, and determine updated verification start loops of the states. The updated verification start loops of the states can be stored in the memory 140 in association with the word line group, such as group based verification start loops of states 145 in FIG. 1. Thus, later on, for further writes to word lines (e.g., the same word line as the first write, or other word lines) in the word line group, the updated verification start loops of the states can be used to perform program-verify loops for writing to the word lines.

The updated verification start loops of states can be determined based on various suitable techniques. In some examples, at each program-verify loop of the first program-verify loops, a total number of turn-on memory cells (e.g., sufficiently programmed memory cells) of the word line can be counted for each state, for example based on values in the latch circuits of the page buffer circuit 112. At a specific program-verify loop, when the total number of turn-on memory cells of a state is increased to be equal or larger than a threshold, the specific program-verify loop can be determined to be the updated verification start loop of the state.

According to an aspect of the disclosure, word lines of similar program speed can form a word line group. Thus, when verification start loops of states are determined based on a write to one of the word lines in the word line group, the determine verification start loops of states can be used in program-verify loops to write to any word lines in the word line group in an example. In some examples, program speed of memory cells at different word lines can be characterized by manufacture of the semiconductor memory devices, then word lines can be divided into word line groups based on the program speed characterization.

In some examples, a word line group can be defined using addresses of the word lines in the word line group. The definition of word line groups can be suitably stored on each of the semiconductor memory devices. In an example, the definition of the word line groups can be stored in a special partition of the memory cell array 102. For example, the memory cell array 102 includes an initialization partition 165. The initialization partition 165 is a portion of the memory cell array 102 that can be loaded to the peripheral circuitry 101 at a time when the semiconductor memory device 100 is powered up. In some examples, at the time of power up, information in the initialization partition 165 is loaded into the peripheral circuitry 101 to configure the peripheral circuitry 101. In an example, the definition of the word line groups can be stored in the initialization partition 165 and loaded to the peripheral circuitry 101 at the time of power up. In another example, the definition of the word line groups can be implemented in firmware explicitly or implicitly. In some embodiments, the definition of the word line groups is stored in a non-volatile form, thus the definition of the word line groups will not be lost when power is disconnected.

In some examples, word line groups can be block based, and each word line group includes one or more blocks, such as one or more BLOCK-1 TO BLOCK-N in FIG. 1. In some examples, word line groups can be word line based, and each word line group includes multiple word lines. In another example, word line groups can be single word line based, and each word line group includes a single word line.

In some embodiments, the determined verification start loops of states can be stored in a volatile form. In an example, the memory 140 is implemented using static random access memory (SRAM). In another example, the memory 140 is implemented using suitable register circuits. Then, after each power on, verification start loops of states can be re-determined and stored. Thus, when the program speed changes, such as due to increase of PE cycles, the verification start loops for states can be re-determined at each power on time to compensate for the change of the program speed.

It is noted that, in some examples, the group based verification start loop determination module 130 is implemented as firmware to be executed by processors; in some other examples, the group based verification start loop determination module 130 is implemented using circuits.

Figure 2:
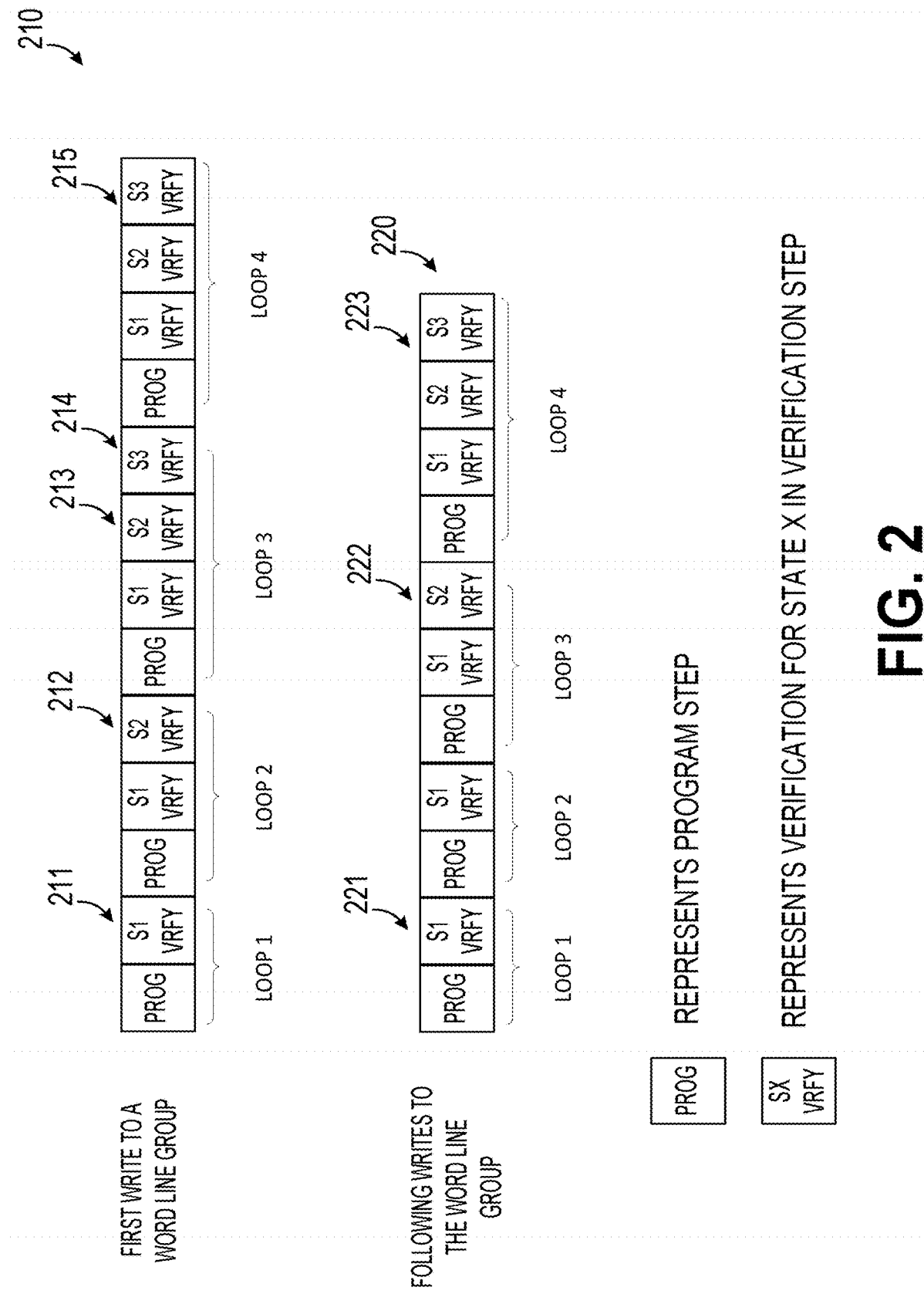
FIG. 2 shows a diagram illustrating program-verify loops that are used in write operations to a word line group according to some embodiments of the disclosure.

FIG. 2 shows a diagram illustrating program-verify loops that are used in write operations to a word line group in some examples. The word line group includes word lines of similar program speed. In the FIG. 2 example, in response to a first write to a word line in the word line group (e.g., first write to the word line group after a power on), a set of program-verify loops with predefined verification start loops as shown by 210 can be used. In some examples, the predefined verification start loops are set as early as possible to ensure correct programming for memory cells of fast programing speed. For example, the predefined verification start loop of S1 is in the first program-verify loop as shown by 211; the predefined verification start loop of S2 is in the second program-verify loop as shown by 212; the predefined verification start loop of S3 is in the third program-verify loop as shown by 214.

In some embodiments, a write control, such as the write control 123 can, in the verification step, count a total number of turn-on memory cells for each state, compare the total number of turn-on memory cells of state to a threshold, and determine verification start loop for the state for using in the following writes to the word line group accordingly. In some examples, the threshold is a suitable number depending on error correction capability.

For example, the threshold is assumed to be 2. In a first program-verify loop (LOOP1), at verification 211, the total number of turn-on memory cells of S1 is 3, thus the write control 123 determines that the verification start loop of S1 is LOOP1. In a second program-verify loop (LOOP2), at verification 212, the total number of turn-on memory cells of S2 is 0, thus the write control 123 determines that the verification start loop of S2 can be later loops. In the third program-verify loop (LOOP3), at verification 213, the total number of turn-on memory cells of S2 is 2, thus the write control 123 determines that the verification start loop of S2 is LOOP3.

Similarly, in an example, in the LOOP3, at verification 214, the total number of turn-on memory cells of S3 is 1, thus the write control 123 determines that the verification start loop of S3 can be later loops. In the fourth program-verify loop (LOOP4), at verification 215, the total number of turn-on memory cells is 4, thus the write control 123 determines that the verification start loop of S3 is LOOP4.

Accordingly, in the FIG. 2 example, for following writes to word lines in the word line group, program-verify loops with the updated verification start loops as shown by 220 can be used. For example, the updated verification start loop of S1 is LOOP1 as shown by 221; the updated verification start loop of S2 is LOOP3 as shown by 222; and the updated verification start loop of S3 is LOOP4 as shown by 223. As shown, using the updated verification start loops, the total program time for writing to a word line can be reduced.

It is noted that the example in FIG. 2 is for illustration, other suitable predefined verification start loops can be used in the first write to the word line group.

Figure 3:
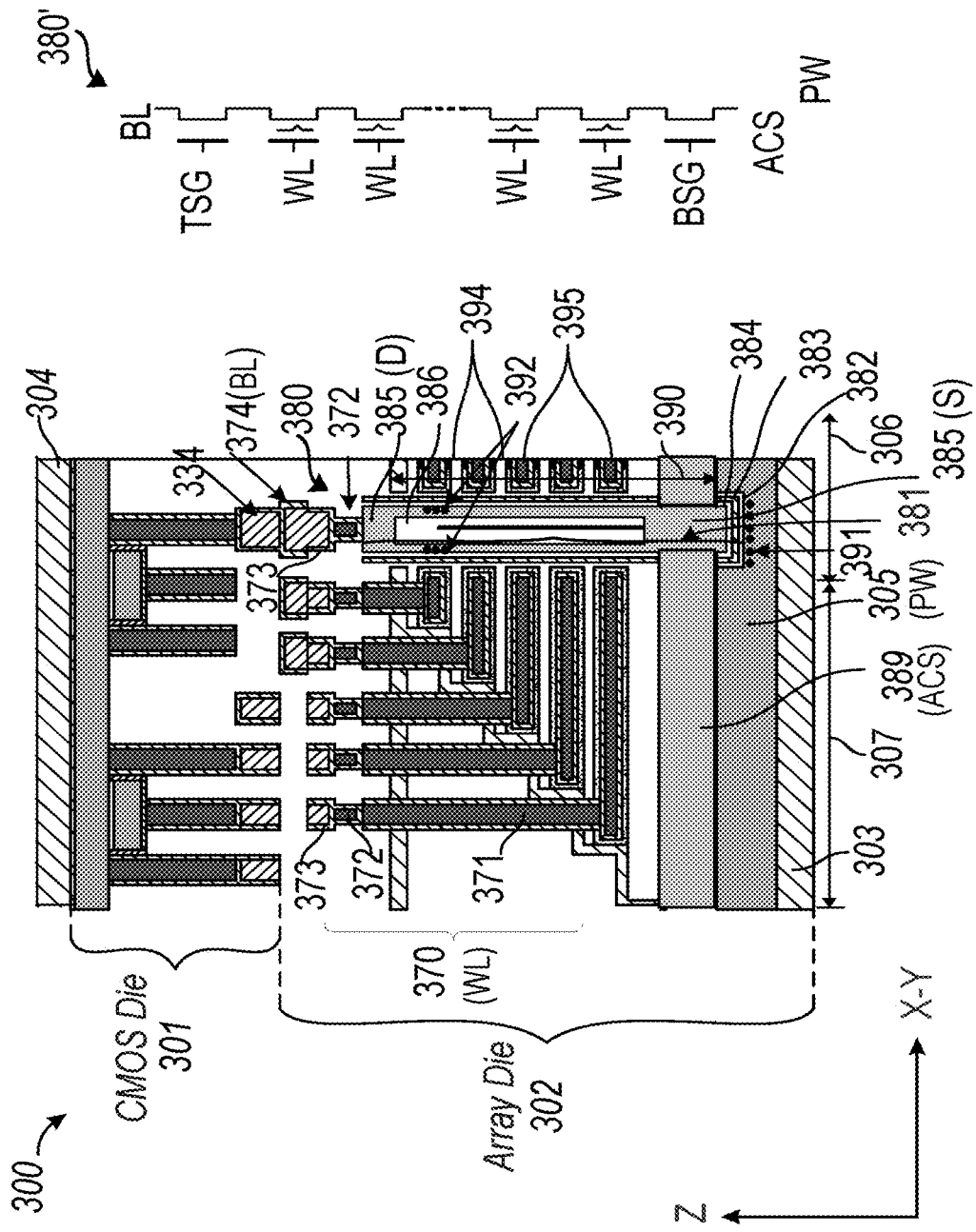
FIG. 3 shows a cross-sectional view of a semiconductor memory device, and a schematic symbol of a memory cell string according to some embodiments of the disclosure.

FIG. 3 shows a cross-sectional view of a semiconductor memory device 300 according to some embodiments of the disclosure. The semiconductor memory device 300 can be the semiconductor memory device 100 in some examples. The semiconductor memory device 300 includes an array die 302 and a CMOS die 301 bonded together according to some embodiments of the disclosure.

It is noted that, in some embodiments, a semiconductor memory device can include multiple array dies and a CMOS die. The multiple array dies and the CMOS die can be stacked and bonded together. The CMOS die is respectively coupled to the multiple array dies, and can drive the respective array dies to operate in the similar manner as the semiconductor memory device 300.

The array die 302 includes a substrate 303, and memory cells formed on the substrate 303. The CMOS die 301 includes a substrate 304, and peripheral circuitry formed on the substrate 304. For simplicity, the main surface of the substrate 303 is referred to as an X-Y plane, and the direction perpendicular to the main surface is referred to as Z direction.

The substrate 303 and the substrate 304 respectively can be any suitable substrate, such as a silicon (Si) substrate, a germanium (Ge) substrate, a silicon-germanium (SiGe) substrate, and/or a silicon-on-insulator (SOI) substrate. The substrate 303 and the substrate 304 respectively may include a semiconductor material, for example, a Group IV semiconductor, a Group III-V compound semiconductor, or a Group II-VI oxide semiconductor. The Group IV semiconductor may include Si, Ge, or SiGe. The substrate 303 and the substrate 304 respectively may be a bulk wafer or an epitaxial layer.

The semiconductor memory device 300 includes memory cell arrays (e.g., memory cell array 102) and peripheral circuitry (e.g., the address decoding circuit, the page buffer circuit, the data I/O circuit, the voltage generator, the main controller and the like). In the FIG. 3 example, the memory cell arrays are formed on the substrate 303 of the array die 302 and the peripheral circuitry is formed on the substrate 304 of the CMOS die 301. The array die 302 and the CMOS die 301 are disposed face to face (the surface with circuitry disposed on is referred to as face, and the opposite surface is referred to as back), and bonded together.

In some examples, wells can be formed in the substrate 302 respectively for blocks as body portions for the blocks. In the FIG. 3 example, a P-type well 305 is formed in the substrate 303, and a block of three dimensional (3D) NAND memory cell strings can be formed in the P-type well 305. The P-type well 305 can form a body portion (e.g., in connection with a PW terminal) for the 3D NAND memory cell strings, and a voltage that is referred to as PW can be applied to the P-type well 305 via the PW terminal. In some examples, the memory cell array is formed in a core region 306 as an array of vertical memory cell strings. Besides the core region 306 and the periphery region, the array die 302 includes a staircase region 307 (also referred to as a connection region in some examples) to facilitate making connections to, for example, gates of the memory cells in the vertical memory cell strings, gates of the select transistors, and the like. The gates of the memory cells in the vertical memory cell strings correspond to word lines for the NAND memory architecture.

In the FIG. 3 example, a vertical memory cell string 380 is shown as representation of an array of vertical memory cell strings formed in the core region 306. FIG. 3 also shows a schematic symbol version of the vertical memory cell string 380' corresponding to the vertical memory cell string 380. The vertical memory cell strings 380 are formed in a stack of layers 390. The stack of layers 390 includes gate layers 395 and insulating layers 394 that are stacked alternatingly. The gate layers 395 and the insulating layers 394 are configured to form transistors that are stacked vertically. In some examples, the stack of transistors includes memory cells and select transistors, such as one or more bottom select transistors, one or more top select transistors and the like. In some examples, the stack of transistors can include one or more dummy select transistors. The gate layers 395 correspond to gates of the transistors. The gate layers 395 are made of gate stack materials, such as high dielectric constant (high-k) gate insulator layers, metal gate (MG) electrode, and the like. The insulating layers 394 are made of insulating material(s), such as silicon nitride, silicon dioxide, and the like.

According to some aspects of the disclosure, the vertical memory cell strings are formed of channel structures 381 that extend vertically (Z direction) into the stack of layers 390. The channel structures 381 can be disposed separate from each other in the X-Y plane. In some embodiments, the channel structures 381 are disposed in the form of arrays between gate line cut structures (not shown). The gate line cut structures are used to facilitate replacement of sacrificial layers with the gate layers 395 in a gate-last process. The arrays of the channel structures 381 can have any suitable array shape, such as a matrix array shape along the X direction and the Y direction, a zig-zag array shape along the X or Y direction, a beehive (e.g., hexagonal) array shape, and the like. In some embodiments, each of the channel structures has a circular shape in the X-Y plane, and a pillar shape in the X-Z plane and Y-Z plane. In some embodiments, the quantity and arrangement of the channel structures between gate line cut structures is not limited.

In some embodiments, the channel structure 381 has a pillar shape that extends in the Z direction that is perpendicular to the direction of the main surface of the substrate 303. In an embodiment, the channel structure 381 is formed by materials in the circular shape in the X-Y plane, and extends in the Z direction. For example, the channel structure 381 includes function layers, such as a blocking insulating layer 382 (e.g., silicon oxide), a charge storage layer (e.g., silicon nitride) 383, a tunneling insulating layer 384 (e.g., silicon oxide), a semiconductor layer 385, and an insulating layer 386 that have the circular shape in the X-Y plane, and extend in the Z direction. In an example, the blocking insulating layer 382 (e.g., silicon oxide) is formed on the sidewall of a hole (into the stack of layers 380) for the channel structure 381, and then the charge storage layer (e.g., silicon nitride) 383, the tunneling insulating layer 384, the semiconductor layer 385, and the insulating layer 386 are sequentially stacked from the sidewall. The semiconductor layer 385 can be any suitable semiconductor material, such as polysilicon or monocrystalline silicon, and the semiconductor material may be un-doped or may include a p-type or n-type dopant. In some examples, the semiconductor material is intrinsic silicon material that is un-doped. However due to defects, intrinsic silicon material can have a carrier density in the order of $10^{10}$ cm$^{-3}$ in some examples. The insulating layer 386 is formed of an insulating material, such as silicon oxide and/or silicon nitride, and/or may be formed as an air gap.

According to some aspects of the disclosure, the channel structure 381 and the stack of layers 390 together form the memory cell string 380. For example, the semiconductor layer 385 corresponds to the channel portions for transistors in the memory cell string 380, and the gate layers 395 corresponds to the gates of the transistors in the memory cells string 380. Generally, a transistor has a gate that controls a channel, and has a drain and a source at each side of the channel. For simplicity, in the FIG. 3 example, the upper side of the channel for transistors in FIG. 3 is referred to as the drain, and the bottom side of the channel for transistors in FIG. 3 is referred to as the source. It is noted that the drain and the source can be switched under certain driving configurations. In the FIG. 3 example, the semiconductor layer 385 corresponds to connected channels of the transistors. For a specific transistor, the drain of the specific transistor is connected with a source of an upper transistor above the specific transistor, and the source of the specific transistor is connected with a drain of lower transistor below the specific transistor. Thus, the transistors in the memory cell string 380 are connected in series.

The memory cell string 380 includes memory cell transistors (or referred to as memory cells). A memory cell transistor can have different threshold voltages based on carrier trappings in a portion of the charge storage layer 383 that corresponds to a floating gate for the memory cell transistor. For example, when a significant amount of holes are trapped (stored) in the floating gate of the memory cell transistor, the threshold voltage of the memory cell transistor is lower than a predefined value, then the memory cell transistor is in a un-programed state (also referred to as erased state) corresponding to logic "11" in two binary bits. When holes are expelled from the floating gate (or electrons are trapped in the floating gate), the threshold voltage of the memory cell transistor is increased, thus the memory cell transistor can be programmed to other suitable states, such as S2, S3, . . . and the like.

The memory cell string 380 includes one or more top select transistors configured to couple/de-couple the memory cells in the memory cell string 380 to a bit line, and includes one or more bottom select transistors configured to couple/de-couple the memory cells in the memory cell string 380 to the ACS.

The top select transistors are controlled by top select gates (TSG). For example, when a TSG voltage (voltage applied to the TSG) is larger than a threshold voltage of the top select transistors, the top select transistors are turned on and the memory cells are coupled to the bit line; and when the TSG voltage (voltage applied to the TSG) is smaller than the threshold voltage of the top select transistors, the top select transistors are turned off and the memory cells are de-coupled to the bit line.

Similarly, the bottom select transistors are controlled by bottom select gates (BSG). For example, when a BSG voltage (voltage applied to the BSG) is larger than a threshold voltage of the bottom select transistors, the bottom select transistors are turned on and the memory cells are coupled to the ACS; and when the BSG voltage (voltage applied to the BSG) is smaller than the threshold voltage of the bottom select transistors, the bottom select transistors are turned off and the memory cells are de-coupled to the ACS.

According to some aspects of the disclosure, the bottom portion of the semiconductor layer 385 in the channel hole corresponds to a source side of the vertical memory cell string 380, and the bottom portion is labeled as 385(S). A common source layer 389 is formed in conductive connection with the source of the vertical memory cell string 380. The common source layer 389 can includes one or more layers. In some examples, the common source layer 389 includes silicon material, such as intrinsic polysilicon, doped polysilicon (such as N-type doped silicon, P-type doped silicon) and the like. In some examples, the common source layer 389 may include metal silicide to improve conductivity. The common source layer 389 is similarly in conductive connection with sources of other vertical memory cell strings (not shown), and thus forms an array common source (ACS).

In some examples, when the vertical memory cell strings 380 are configured to be erased by block, the common source layer 389 can extend and cover the core regions of a block and staircase regions for the block. In some examples, for different blocks that are erased separately, the common source layer 389 may be suitably insulated for the different blocks.

In the FIG. 3 example, in the channel structure 381, the semiconductor layer 385 extends vertically from the source side of the channel structure 381 up, and forms a top portion corresponds to a drain side of the vertical memory cell string 380. The top portion of the semiconductor layer 385 is labeled as 385(D). It is noted that drain side and the source side are named for the ease of description. The drain side and the source side may function differently from the names.

In the FIG. 3 example, a connection structure, such as a via 372 with a metal wire 373, a bonding structure 374, and the like, can be formed to electrically couple the top portion of the semiconductor layer 385(D) to a bit line (BL).

Further in FIG. 3 example, the staircase region 307 includes a staircase that is formed to facilitate word line connections to the gates of transistors (e.g., memory cells, top select transistor(s), bottom select transistor(s)). For example, a word line connection structure 370 includes a contact structure 371, a via structure 372, and metal wire 373 that are conductively coupled together. The word line connection structure 370 can electrically couple a WL to a gate terminal of a transistor in the memory cell string 380.

In the FIG. 3 example, the array die 302 and the CMOS die 301 are disposed face-to-face (circuitry side is face, and the substrate side is back) and bonded together. Generally, the peripheral circuitry on the CMOS die interfaces the semiconductor memory device 300 with external circuitry.

In the FIG. 3 example, the CMOS die 301 and the array die 302 respectively include bonding structures that can be aligned with each other. For example the CMOS die 301 includes a bonding structure 334 and the array die 302 includes a corresponding bonding structure 374. The array die 302 and the CMOS die 301 can be suitably aligned, thus the bonding structure 334 is aligned with the bonding structure 374. When the array die 302 and the CMOS die 301 are bonded together, the bonding structure 334 is respectively bonded and electrically coupled with the bonding structure 374.

Figure 4:
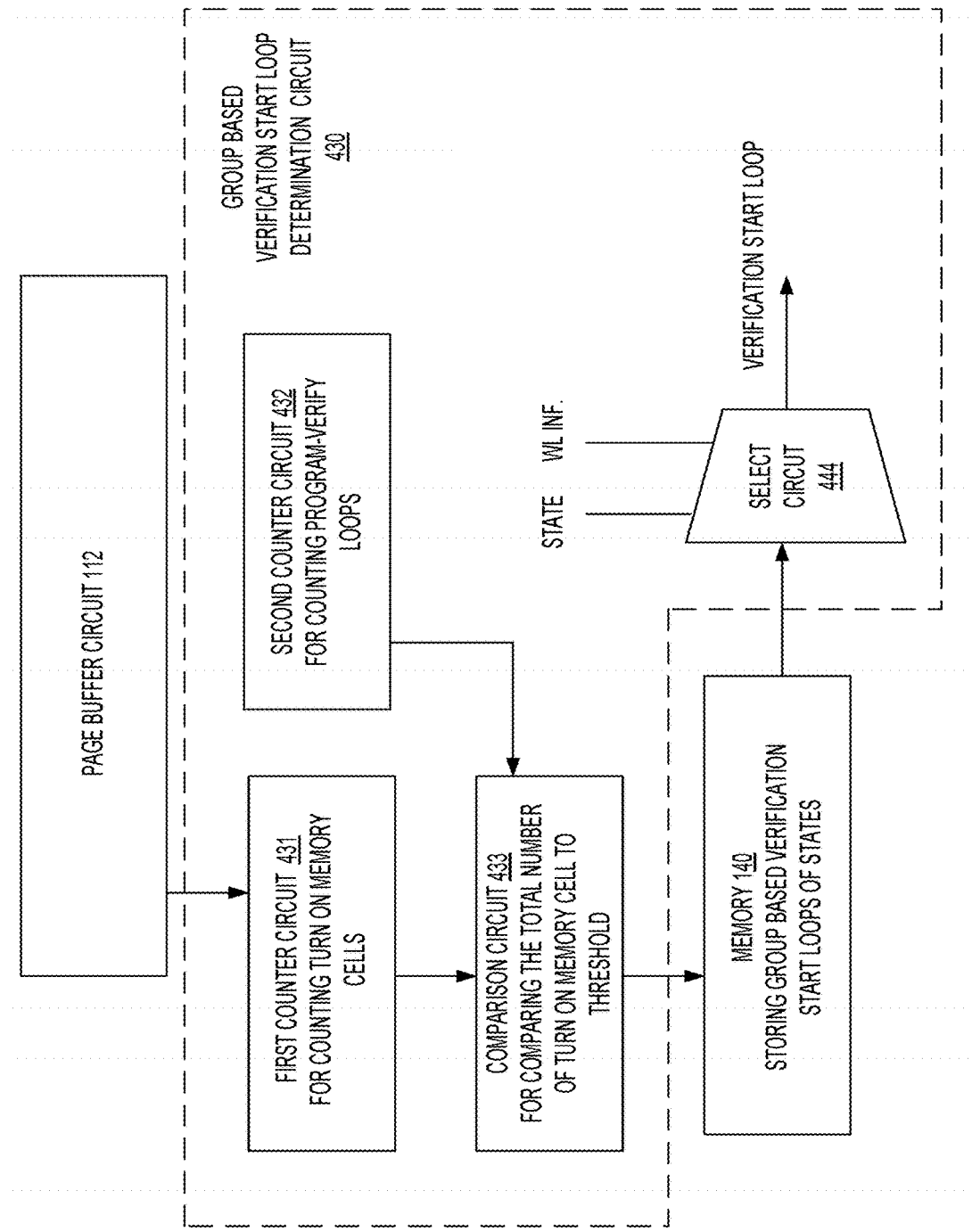
FIG. 4 shows a block diagram of a group based verification start loop determination circuit according to some embodiments of the disclosure.

FIG. 4 shows a block diagram of a group based verification start loop determination circuit 430 according to some embodiments of the disclosure. The group based verification start loop determination circuit 430 can be used in the place of the group based verification start loop determination module 130 in the semiconductor memory device 100. The group based verification start loop determination circuit 430 is coupled to, for example the page buffer circuit 112 and the memory 140, as shown in FIG. 4.

The group based verification start loop determination circuit 430 is configured to detect sensing results during first program-verify loops that are performed in response to a first write operation to a first word line in a word line group, and determine verification start loops of the multiple states based on the sensing results during the first program-verify loops. The verification start loops of the multiple states can be stored in the memory 140 in association with the word line group. Further, in response to a second write operation to a second word line in the word line group, the group based verification start loop determination circuit 430 can access the memory 140 to retrieve the verification start loops of the multiple states associated with the word line group. Then, second program-verify loops with the retrieved verification start loops of the multiple states can be performed in the second write operation.

Specifically, in the FIG. 4 example, the group based verification start loop determination circuit 430 includes a first counter circuit 431, a second counter circuit 432, a comparison circuit 433 and a select circuit 444 coupled together as shown in FIG. 4.

In some examples, the first counter circuit 431 is coupled to latch circuits in the page buffer circuit 112. The latch circuits are coupled to the bit lines, and values in the latch circuits can indicate the programming status of the memory cells coupled to the bit lines. For example, when a memory cell coupled to a bit line is sufficiently programmed (threshold voltage is in a range corresponding to a state for writing a multi-bit value to the memory cell), the memory cell is turned on during a verification of the state, and the value in the latch circuit associated with the bit line can switch from, for example, "0" to "1". The first counter circuit 431 can count the total number of memory cells that are turned on for each state (referred to as the total number of turn-on memory cells of the state) based on values in the latch circuits.

The second counter circuit 432 is configured to count loops in the program-verify loops. The comparison circuit 433 is configured to compare the total number of turn-on memory cells of a state to a threshold. In some examples, a same threshold is used for all of the states. In some other examples, different thresholds can be used for different states. When the total number of turn-on memory cells is equal or larger than the threshold, in an example, the comparison circuit 433 can cause the counted number of loops by the second counter circuit 432 to be stored as a verification start loop of the state in the memory 140 in association with a word line group.

The memory 140 can store the group based verification start loops of the states in various forms. FIG. 5 shows a table of values that are stored in association with states and word line groups. Each value is associated with a state and a word line group. When a state and a word line group are provided, a value associated with the state and the word line group can be located and retrieved.

Referring back to FIG. 4, the select circuit 444 can retrieve a verification start loop of a state in association with a word line group based on the state and word line information. For example, the select circuit 444 can determine the word line group based on the word line information, and then locate and retrieve the verification start loop associated with the state and the word line group. In some examples, the memory 140 includes registers configured to store the verification start loops, and the registers are indexed based on the states and the word line groups. The select circuit 444 includes a multiplexer (MUX) that is coupled to the registers. Then, one of the registers can be selected by the MUX based on the state and the word line group, and value of the selected register is output from the select circuit 444 as the verification start loop.

In some embodiments, the memory 140 is implemented as registers that are volatile memory and can lose stored data in response to a power off (or power disconnection). In some examples, in response to a power up, values in the memory 140 are reset to default value(s), such as 0 or verification start loops with the earliest verification start loops of states. Then, to perform a first write to a first word line in a word line group (the first word line can be any word line in the word line group), the select circuit 444 outputs the default values associated with the states. When the default values are detected, first program-verify loops with default verification start loops of the states (e.g., earliest verification start loops of the states) can be used to perform the first write to the first word line in the word line group. The group based verification start loop determination circuit 430 can determine updated verification start loops of the states based on sensing results during the first program-verify loops, and the updated verification start loops of the states can be stored in the memory 140 in association with the word line group. Then, in following writes to word lines in the word line group, the updated verification start loops of the states can be retrieved and used in the following program-verify loops.

Thus, in some examples, when program speed changes, for example, with increase of PE cycles, the verification start loops of states for word line groups can be reset and re-determined in response to a power up.

In some other embodiments, the reset and re-determination of the verification start loops of states for word line groups can be triggered by other suitable triggers, such as a timer, a reset command, and the like.

The word line groups can be suitable defined. In some examples, word line groups are single word line based, thus each word line group includes a single word line. In some other examples, word line groups are section based, thus each word line group includes multiple word lines. In some other examples, word line groups are block based, thus each word line group includes one or more blocks.

The word line groups can be determined and defined by various techniques. In some examples, the word line groups are determined based on program speed characterization.

Figure 6:
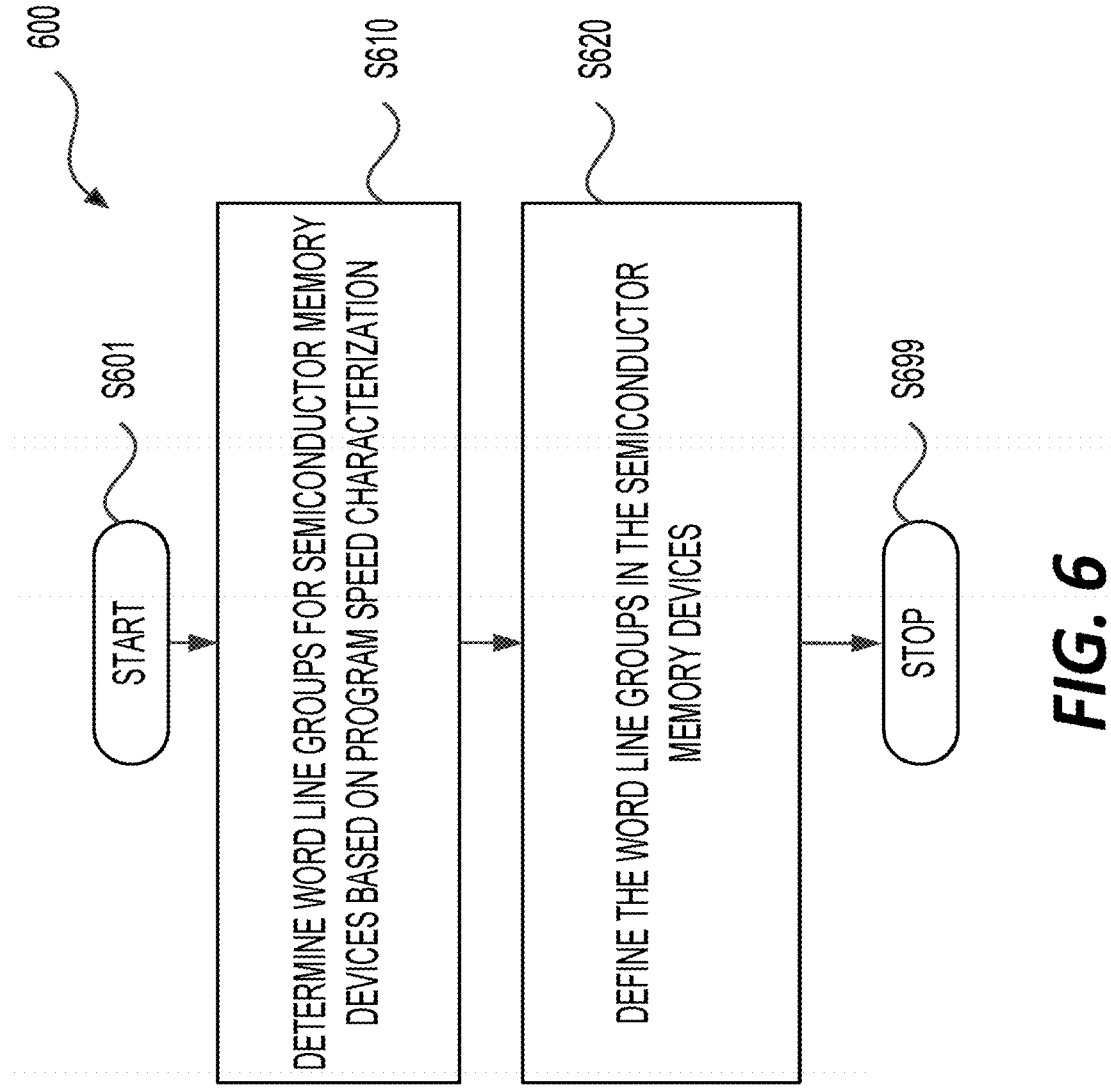
FIG. 6 shows a flow chart outlining a process for determining and defining word line groups according to some embodiments of the disclosure.

FIG. 6 shows a flow chart outlining a process 600 for determining and defining word line groups according to some embodiments of the disclosure. In some examples, the process 600 is performed by a semiconductor memory device provider who provides a semiconductor memory device, such as the semiconductor memory device 100, the semiconductor memory device 300, and the like. In some examples, the semiconductor memory device includes a first die (e.g., array die), and a second die (e.g., CMOS die). The first die incudes a memory cell array, and the second die includes the peripheral circuitry of the memory cell array. The first die and the second die are bonded together, thus the peripheral circuitry is conductively coupled with the memory cell array. The process 400 starts at S601 and proceeds to S610.

At S610, word line groups for semiconductor memory devices are determined based on program speed characterization. In some examples, samples of the semiconductor memory devices are tested to determine program speed characteristics, such as program speed of word lines, program speed variations over PE cycles and the like. Based on the program speed characterization, word lines can be divided into word line groups. A word line group can include a single word line, a section of word lines, or a block.

At S620, word line groups are defined in the semiconductor memory devices. In some examples, the word line groups are defined in algorithm that is implemented in firmware. In some other examples, the word line groups are defined as configurations stored in the initialization partition 165. Then, the process proceeds to S699 and terminates.

Figure 7:
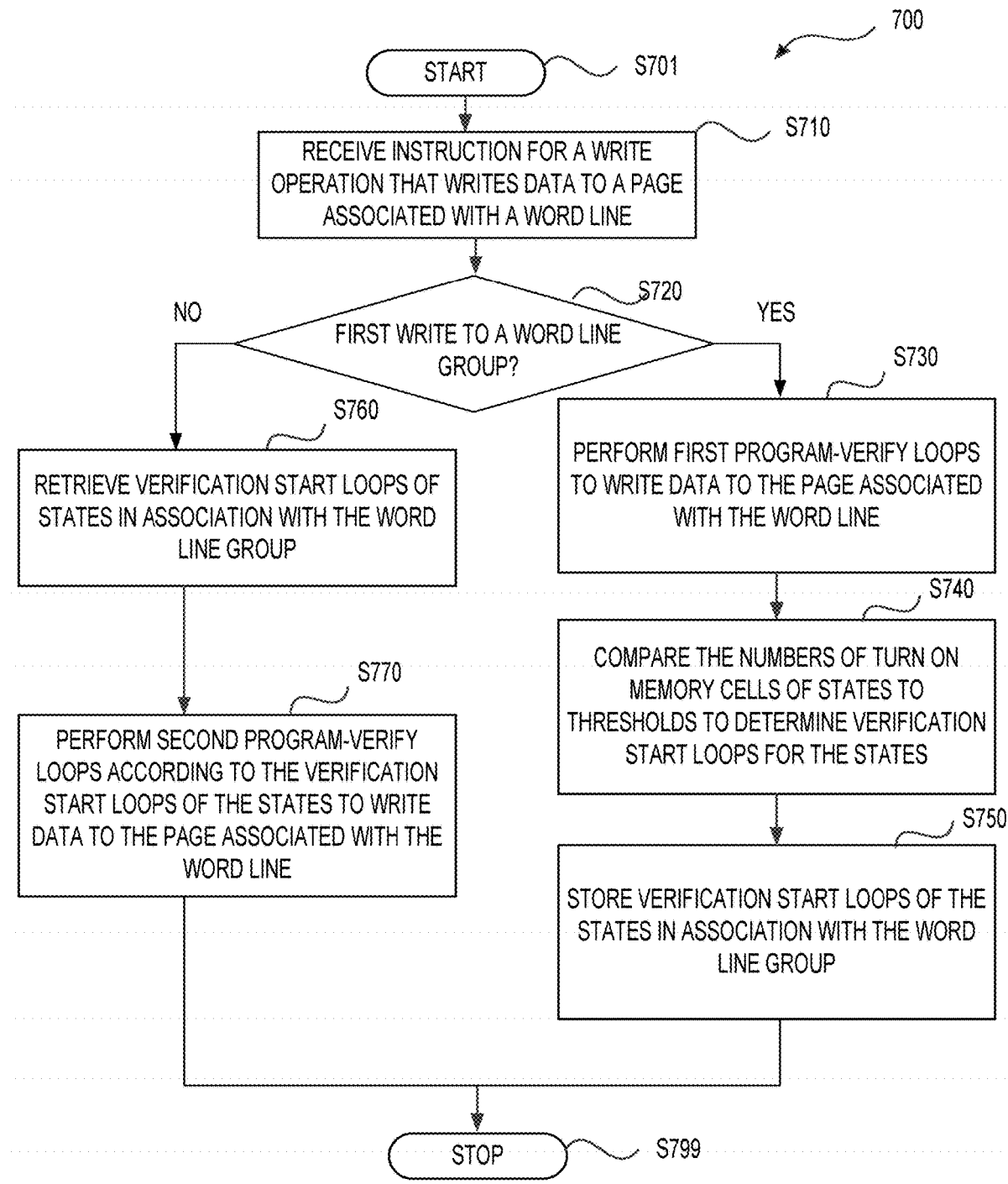
FIG. 7 shows a flow chart outlining a process for programming a semiconductor memory device according to some embodiments of the disclosure.

FIG. 7 shows a flow chart outlining a process 700 according to some embodiments of the disclosure. In some examples, the process 700 is performed by a write control portion, such as the write control 123. The process 700 starts at S701 and proceeds to S710.

At S710, the write control 123 receives an instruction for a write operation that writes data to a page associated with a word line.

At S720, the write control 123 determines whether the write operation is a first write operation to a word line group. When the write operation is the first write operation to a word line group, the process proceeds to S730; otherwise, the process proceeds to S760.

At S730, the write operation is the first write to the word line group, the write control 123 can cause first program-verify loops to be performed. The first program-verify loops are performed to write data into the page associated with the word line. In some examples, the first program-verify loops uses default verification start loops of states that are designed to perform verification of states at the earliest loops to avoid programming errors. Further, the write control 123 can monitor sensing results of the verifications during the first program-verify loops. For example, the write control 123 can count the total number of turn-on memory cells for each state that can increase by loops in the first program-verify loops.

At S740, the write control 123 compares the total numbers of turn-on memory cells of states to thresholds to determine verification start loops for the states. For example, for a state, the write control 123 compares a total number of turn-on memory cells of the state (e.g., including turn-on memory cells by previous loops) to a threshold, and determines a loop to be the verification start loop when the total number of turn-on memory cells at the loop is equal or larger than the threshold.

At S750, the write control 123 stores the verification start loops of the states in association with the word line group, for example in the memory 140. Then, the process proceeds to S799, and the write operation is finished.

At S760, the write operation is not the first write to the word line group, the write control 123 retrieves, for example from the memory 140, verification start loops of states in association with the word line group.

At S770, the write control 123 performs second program-verify loops according to the verification start loops of the states, and writes data to the page associated with the word line. Then, the process proceeds to S799 and the write operation is finished.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor memory device, comprising:
a memory cell array comprising a block of memory cells; and
peripheral circuitry coupled with the memory cell array, the peripheral circuitry being configured to:
perform first program-verify loops in response to a first write operation to a first word line in a word line group comprising one or more word lines, to program memory cells associated with the first word line to multiple states;
determine verification start loops of the multiple states based on sensing results in the first program-verify loops; and
perform second program-verify loops with the determined verification start loops of the multiple states in response to a second write operation to a second word line in the word line group.

2. The semiconductor memory device of claim 1, wherein the peripheral circuitry is configured to count a total number of turn-on memory cells of a state during the first program-verify loops, and determine a loop to be a verification start loop of the state when the total number of turn-on memory cells of the state at the loop satisfies a requirement.

3. The semiconductor memory device of claim 2, wherein the peripheral circuitry comprises:
a first counter circuit configured to count the total number of turn-on memory cells of the state;

a second counter circuit configured to count a number of loops in the first program-verify loops; and a comparison circuit configured to compare the total number of turn-on memory cells of the state to a threshold, and cause the number of loops to be stored as the verification start loop with the state in response to the total number of turn-on memory cells of the state being equal or larger than the threshold.

4. The semiconductor memory device of claim 1, wherein the peripheral circuitry comprises:

a page buffer circuit with latch circuits coupled to bit lines, values in the latch circuits during the first program-verify loops being indicative of the sensing results in the first program-verify loops.

5. The semiconductor memory device of claim 1, wherein the peripheral circuitry comprises:

a memory configured to store the determined verification start loops of the multiple states in association with the word line group.

6. The semiconductor memory device of claim 5, wherein the memory is a volatile memory that loses the determined verification start loops of the multiple states in response to a power off.

7. The semiconductor memory device of claim 1, wherein the peripheral circuitry is configured to perform, after a power up of the semiconductor memory device, the first program-verify loops in response to the first write operation to the first word line in the word line group.

8. The semiconductor memory device of claim 1, wherein the word line group is defined as at least one of:

comprising the first word line;

comprising the first word line and one or more other word lines of the block; and comprising the block.

9. The semiconductor memory device of claim 1, wherein the word line group is defined in a non-volatile portion of the semiconductor memory device.

10. The semiconductor memory device of claim 1, wherein the second word line is the first word line or another word line in the word line group.

11. The semiconductor memory device of claim 1, wherein the multiple states respectively represent values of multiple binary bits.

12. A method for programming a semiconductor memory device, comprising:

performing first program-verify loops in response to a first write operation to a first word line in a word line group that comprises one or more word lines, the first program-verify loops programing memory cells associated with the first word line in the word line group to multiple states;

determining verification start loops of the multiple states based on sensing results during the first program-verify loops; and performing second program-verify loops with the determined verification start loops of the multiple states in response to a second write operation to a second word line in the word line group.

13. The method of claim 12, wherein the determining the verification start loops of the multiple states based on the sensing results during the first program-verify loops further comprises:

counting a total number of turn-on memory cells of a state; and determining a loop to be a verification start loop of the state when the total number of turn-on memory cells of the state by the loop satisfies a requirement.

14. The method of claim 13, further comprising:

comparing the total number of turn-on memory cells of the state to a threshold; and determining the verification start loop based on a result of the comparison.

15. The method of claim 12, further comprising:

sensing values in latch circuits that are coupled to bit lines of the block, values in the latch circuits during the first program-verify loops being indicative of the sensing results in the first program-verify loops.

16. The method of claim 12, further comprising:

storing the determined verification start loops of the multiple states in association with the word line group in a memory.

17. The method of claim 16, wherein the memory is a volatile memory that loses the determined verification start loops of the multiple states in response to a power off.

18. The method of claim 12, wherein the performing the first program-verify loops in response to the first write operation to the first word line in the word line group further comprises:

performing, after a power up of the semiconductor memory device, the first program-verify loops in response to the first write operation to the first word line in the word line group.

19. The method of claim 12, wherein the word line group is defined as at least one of:

comprising the first word line;

comprising the first word line and one or more other word lines of the block; and comprising the block.

20. The method of claim 12, wherein the word line group is defined in a non-volatile portion of the semiconductor memory device.

* * * * *